United States Patent [19]

Scarzello et al.

[11] Patent Number: 5,038,103
[45] Date of Patent: Aug. 6, 1991

[54] OPTICAL FIBER MAGNETOMETER

[75] Inventors: John F. Scarzello, Columbia; Jack Finkel, Baltimore, both of Md.

[73] Assignee: The United States of America as represented by the Secretary of the Navy, Washington, D.C.

[21] Appl. No.: 725,709

[22] Filed: Apr. 22, 1985

[51] Int. Cl.⁵ .................... G01R 33/02; G01R 33/032
[52] U.S. Cl. .................... 324/244; 250/227; 359/281; 324/96; 324/260
[58] Field of Search ............ 324/244, 245, 246, 247, 324/256, 257, 96, 260; 250/227; 350/377

[56] References Cited

U.S. PATENT DOCUMENTS

| 3,324,394 | 6/1967 | Cheney | 324/97 |
|---|---|---|---|
| 3,693,082 | 9/1972 | Saecklin | 324/96 |
| 3,810,013 | 5/1974 | Muller | 324/96 |
| 4,376,248 | 5/1983 | Giallorenzi et al. | 324/96 |
| 4,433,291 | 2/1984 | Yariv et al. | 324/244 |

Primary Examiner—Reinhard J. Eisenzopf
Assistant Examiner—Robert W. Mueller

[57] ABSTRACT

An optical fiber magnetometer having omnidirectional capability is disclosed herein for measuring a total magnetic field independent of its physical orientation or the direction of the field or fields. A relatively long optical fiber defining a sensing arm for exposure to a magnetic field is wound in the form of a spheroid (like rubber bands on a golf ball or yarn threads on a baseball) to provide optical path lengths of substantially the same total length in every direction through the spheroid winding. The plane of polarization of light transmitted through the optical fiber winding is caused to rotate (Faraday effect) when the fiber or components thereof is exposed parallel to a magnetic field. The extent of plane rotation is determined, inter alia, by the total magnetic field passing through the spheroid winding.

3 Claims, 1 Drawing Sheet

OPTICAL FIBER MAGNETOMETER

BACKGROUND OF THE INVENTION

Numerous designs have been proposed to detect the presence of a localized magnetic field at a particular location and to discriminate it from the earth's relatively stable magnetic field. The earth's magnetic field may be locally distorted by the presence of a localized field. Many types of magnetometers are known in the art for magnetic field detection. Optical fibers have been employed in recent developments for sensing and measuring magnetic fields.

It is known to pass light through a pair of optical fibers, one defining a magnetic field sensing arm and the other a reference arm in the form of an interferometer, and compare relative phase shifts for providing an indication of a magnetic field. Such arrangements are disclosed in U.S. Pat. Nos. 4,376,248 and 4,433,291. In these patents, a magnetostrictive sleeve is fixedly carried on or about the g fiber defining the sensing arm. The magnetostrictive sleeve in the presence of a magnetic field undergoes dimensional changes to stress the fiber to cause a change in its index of refraction and optical path length which, in turn, causes a detectable phase change in light passing therethrough compared with light from a common source passing through the reference arm. Voltage of electricity flowing through a wire may be measured by optically measuring the strength of the magnetic field about the wire. In one embodiment, a plane of polarized light is passed through an optical fiber wound in the form of a coil. The plane is caused to rotate in one direction when the coil is placed in the presence of a magnetic field. This rotation is known as the Faraday effect. U.S. Pat. Nos. 3,324,394; 3,693,082 and 3,810,013 teach arrangement for measuring voltage in a line.

Another arrangement disclosed in U.S. patent application Ser. No. 179,134, filed July 28, 1980, by Sidney Reed for an optical fiber magnetometer, and likewise assigned to the U. S. Government, is for detecting the presence of a localized magnetic field. It employs a continuous optical fiber wound in the form of a loop about an elongate spindle which is located inside a bar of selected metal adapted for gathering or concentrating magnetic flux. The present application is an improvement over U.S. patent application Ser. No. 179,134 because it teaches an optical fiber wound in the form of a spheroid which provides for omnidirectional additive detection of all flux lines of both the earth and a localized source or sources.

The invention provides an improved arrangement for detecting a total magnetic field.

SUMMARY OF THE INVENTION

According to the present invention, there is provided a magnetometer capable of detecting a total magnetic field regardless of its own position or the direction of the magnetic field. It employs an elongate optical fiber wound in the form of a spheroid. Plane polarized light, when passed through the optical fiber in the presence of a magnetic field is caused to rotate in its lengths or runs having components lying parallel to the magnetic field, according to the formula: $\theta = HVL$, where H is the magnetic field, V is the Verdet constant, and L is the optical path length through the fiber.

The direction of plane rotation is determined by the direction of the magnetic field and not fiber orientation or the direction which light propagates through the fiber.

When the optical fiber is wound upon itself in the form of a spheroid (e.g., like rubber bands on a golf ball or yarn on a baseball), it will be appreciated that there is provided an optical waveguide having lengths or runs defining optical paths of about equal length extending in every direction through the spheroid. Therefore, the lengths or runs of the optical fiber have components which lie parallel to flux lines of every magnetic field direction. These fields additively rotate the plane of the polarized light as it passes through the fiber.

OBJECTS OF THE INVENTION

It is, therefore, an object of the invention to provide a magnetometer capable of sensing the total magnetic field at a particular location.

It is another object of the invention to provide an optical fiber magnetometer where plane polarized light passing through an optical fiber is caused to rotate when the fiber is parallel a magnetic field.

It is still another object of the invention to provide an optical fiber magnetometer wherein a sensing arm is defined by the optical fiber wound in the form of a spheriod, whereby polarized light passing there through is caused to rotate in the presence of a magnetic field.

Other objects of the invention will become evident from a reading of the following specification when considered in conjunction with the drawings annexed hereto.

DETAILED DESCRIPTION OF THE INVENTION

The invention is directed to a relatively simple and inexpensive optical fiber magnetometer for measuring total magnetic field (additively) in all directions. It has use in magnetic field surveillance applications including vehicle and target detection.

Figure 1:
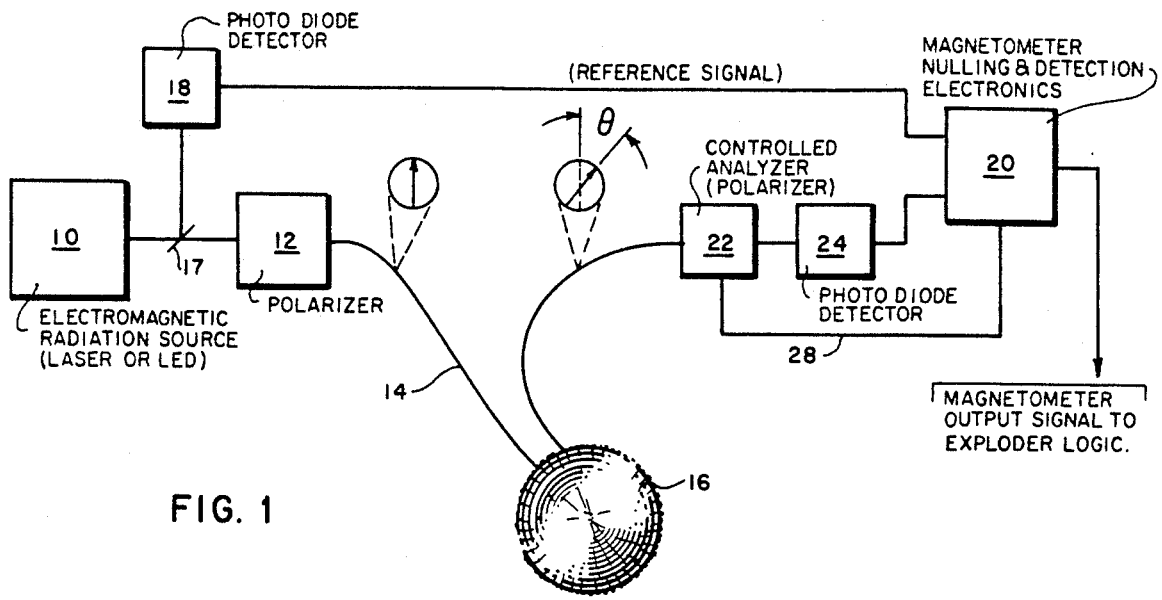
FIG. 1 illustrates optical and electronic components arranged to define a magnetometer for sensing a total magnetic field.

Referring now to FIG. 1, there is shown an electromagnetic radiation source 10 such as a laser or LED and a polarizer 12 which introduces polarized light into the end of an optical fiber waveguide 14 of considerable length (ranging up to as much as one kilometer). Optical fiber 14 is doped with high Verdet constant dopant in order to enhance its sensitivity to ambient magnetic fields. An intermediate portion of optical fiber 14 is wound in the form of a spheroid 16 (like the windings on a golf ball or baseball) to define a sensing arm so that for all ambient magnetic field vectors with respect to the ball, the total optical path lengths is substantially the same in every direction. This is essential to produce a truly total magnetic field sensor. As the polarized light propagates along the optical fiber waveguide material (core), it interacts with lines of magnetic flux which lie parallel to components of the optical fiber to produce a rotation in its plane of polarization (Faraday effect), regardless of the direction the fiber lies or the direction of light propagation, to a stationary observer. This means that the changes (rotation) are additive for each component of optical fiber waveguide which lies parallel to the direction of the magnetic field lines. In effect this makes a truly scalar magnetometer (without dead zones) which is the sum of all magnetic field vectors in a total solid angle about the spheroid (ball) windings.

Light emitted from source 10 is split by a beam splitter 17 and one part reflected to photo diode 18 which provides a reference signal to nulling and detection electronics 20. The other part of the optical output from source 10, passes on through beam splitter 17 to polarizer 12 and on through elongate optical fiber 14, an intermediate portion of which is wound in the form of spheroid 16, on to control analyzer (polarizer) 22. The optical output from analyzer 22 is received by photo diode 24 and converted to an electrical signal which is also fed to the nulling and detection electronics.

Figure 2:
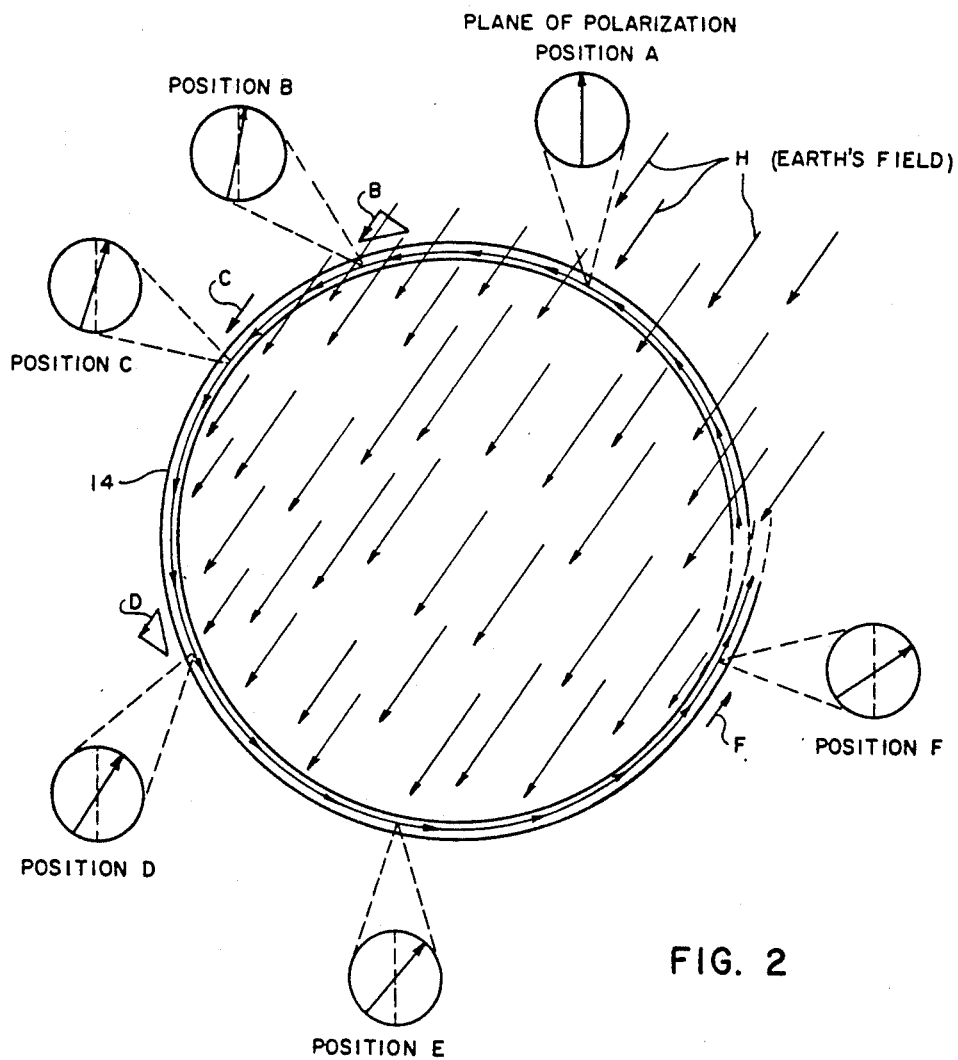
FIG. 2 illustrates one turn of an optical fiber waveguide wound about the circumference of the spheroidal winding relative the lines of a magnetic field.

There is illustrated in FIG. 2 a loop of optical fiber wound substantially about the circumference of the spheroid and exposed in a magnetic field H. It will be realized that hundreds of similar lengths will continue the windings in every direction to make up completed spheroid 16. This fiber when wound upon itself hundreds of times to complete the sphereoid will provide optical paths of substantially equal length extending in every direction through the spheroid. As a plane of polarized light propagates along optical fiber waveguide 14 in the presence of a magnetic field, it is caused to rotate (Faraday effect) only when the fiber lies parallel with the magnetic field, or has a component parallel with the magnetic field. Rotation occurs according to the formula: $\theta = HVL$, where H is the strength of the magnetic field, V is the Verdet constant, and L is the optical path length through the fiber. Rotation of the plane is very limited for every loop of light travel; however; these rotations are multiplied as the light passes through succeeding lengths or loops of the optical fiber windings. For illustration of this, start at an arbitrary position (A) on optical fiber 14 where light is traveling normal to field (H). No rotation is being imparted at position (A) to the plane of polarization, which is indicated as in the vertical. The light propagates farther along optical fiber 14 to position (B) where a component of the fiber lies parallel with the magnetic field. At position (B), the polarized plane will have rotated through some minor angle. At position (C), where field (H) and optical fiber 14 are parallel, the plane of polarization has rotated farther. As light propagates farther about optical fiber to position (D), the component of the optical fiber actually parallel to the magnetic field is less, but here is additional rotation of the plane. At position (E), where the fiber once again lies normal to the magnetic field, no additional rotation is imparted as it has no component parallel to the field. Thereafter, the field component increases the plane rotation through position (F) and on as light propagates through the entire length of the optical fiber.

It will be realized that as that light propagates through succeeding loops, continued rotation is imparted to the plane of polarized light. Furthermore, additional magnetic fields passing through the sphere, cause additive rotation of the plane. The extent of plane rotation for one loop as illustrated in FIG. 2 has been greatly exaggerated for illustration purposes. In practice, the polarization plane in passing through the entire length of the optical fiber may be caused to rotate only a few degrees, depending of course on H, V, and L which are previously defined.

This optical fiber magnetometer requires an ideal source of light, i.e., a constant amplitude and constant polarized incident light energy. Unfortunately, many practical light sources (solid state laser diodes, IR emitters, etc.) have random amplitude fluctuations which are of the same frequency as the measured magnetic field variations of interest.

There is provided a noise compensation system which attempts to eliminate low frequency light source noise in order to detect the variations associated with the measured magnetic field. In order to eliminate any similar amplitude variations cause by noise in optical source 10, a reference channel (reference signal) is formed by splitting the light at beam splitter 17 and directing a part to photo diode 18, the electrical output of which is proportional to source 10 amplitude noise. This signal is then compared to the magnetic sensitive optical fiber light path.

Another purpose of the magnetometer nulling and detection electronics 20 is to optimize the most sensitive detection point. It is usually easier to detect a null than to detect relative changes in a peak signal. For that reason, analyzer 22 is adjusted to detect the amplitude light signals induced by the sensed magnetic field within the optimum operating range of the sensor.

While we have described the principles of our invention in connection with specific apparatus; it will be understood that the description is by way of example and that modifications may be made thereto within the scope of the invention defined by the accompanying claims.

What is claimed is:

1. A magnetometer for measuring total components of a magnetic field, comprising:
   an optical fiber of considerable length wound upon itself in the form of a spheroid, whereby, in any linear direction through the spheroid winding, the total optical path lengths and components of path lengths which lie parallel to that linear direction are substantially equal;
   means introducing plane polarized light into one end of the elongate optical fiber, whereby the plane polarized light in passing through the optical path lengths parallel to a magnetic field is caused to be additively rotated according to the Faraday effect; and
   means for sensing the plane rotation at the other end of the optical fiber for measuring the total components making up the magnetic field passing through the spheroid winding.

2. A total field magnetometer comprising:
   A source of light;
   first means detecting a portion of the light and converting it into an electrical reference signal having amplitude variations according to the source;
   means plane polarizing another portion of the source light;
   a polarization analyzer;
   an elongate optical fiber of considerable length having one end optically connected to the polarized light and its other end optically connected to the polarization analyzer;
   said elongate optical fiber having an intermediate portion wound upon itself in the form of a spheroid to define a sensing arm with total optical path lengths and components of optical path lengths substantially equal in every direction through the winding;

whereby upon exposure to a magnetic field Faraday rotation is imparted to the plane of polarized light independent of orientation of the winding;

second means detecting rotated polarized light output from the polarization analyzer and converting it into another electrical signal; and, means comparing the electrical reference signal and said another electrical signal for eliminating low frequency light source noise.

3. A method of detecting total components of a magnetic field comprising the steps of:

winding an elongate optical fiber upon itself in the form of a spheroid whereby total optical paths extending in every linear direction through the spheroid are of substantially equal length;

exposing the spheroid winding of optical fiber to magnetic fields;

introducing plane polarized light into one end of the optical fiber whereby said plane in passing through the windings which lie parallel and have components which lie parallel to the magnetic field is rotated by the Faraday effect; and measuring the total rotation of the plane of polarized light at the other end of the optical fiber for determining the total magnetic fields passing through the spheroid winding.

* * * * *